(12) United States Patent
Pitman

(10) Patent No.: US 7,116,689 B2
(45) Date of Patent: Oct. 3, 2006

(54) METHOD FOR ESTIMATING AGE RATE OF A LASER

(76) Inventor: Edward A. Pitman, 250 Station Rd., Grantville, PA (US) 17028

( * ) Notice: Subject to any disclaimer, the term of this patent is extended or adjusted under 35 U.S.C. 154(b) by 0 days.

(21) Appl. No.: 10/222,448

(22) Filed: Aug. 16, 2002

(65) Prior Publication Data

US 2004/0032894 A1    Feb. 19, 2004

(51) Int. Cl.
*H01S 3/10* (2006.01)

(52) U.S. Cl. .................................................. 372/26

(58) Field of Classification Search .................. 372/50, 372/26; 324/765, 767
See application file for complete search history.

(56) References Cited

U.S. PATENT DOCUMENTS

| | | | |
|---|---|---|---|
| 4,573,255 A * | 3/1986 | Gordon et al. ............... 438/15 |
| 4,728,188 A | 3/1988 | Kitagawa et al. ........... 356/218 |
| 5,506,826 A | 4/1996 | Kobayashi ................... 369/54 |
| 5,536,934 A | 7/1996 | Hayashi .................... 250/214.1 |
| 5,552,590 A | 9/1996 | Obata et al. ................. 235/455 |
| 5,625,616 A | 4/1997 | Koike et al. ................. 369/116 |
| 5,798,992 A | 8/1998 | Kaneko et al. .............. 369/116 |
| 5,875,274 A * | 2/1999 | Stein ............................ 385/49 |
| 6,195,370 B1 | 2/2001 | Haneda et al. ................. 372/29 |
| 6,249,140 B1 | 6/2001 | Shigihara ..................... 324/767 |
| 6,314,122 B1 * | 11/2001 | Peale ........................... 372/92 |
| 6,350,978 B1 | 2/2002 | Kasai ........................ 250/205 |

OTHER PUBLICATIONS

Welstand et al., "Dual-Function Electroabsorption Waveguide Modulator/Detector for Optoelectronic Transceiver Applications," IEEE Photonics Technology Letters, vol. 8, No. 11, Nov. 1996, pp. 1540-1542.*

* cited by examiner

*Primary Examiner*—Minsun Oh Harvey
*Assistant Examiner*—James Menefee

(57) ABSTRACT

A method of evaluating a laser comprises providing a current into the laser and measuring a voltage output of an electroabsorptive modulator (EAM) coupled to the laser.

A device under test includes a laser, and an electroabsorptive modulator (EAM), wherein said EAM monitors an output of said laser.

8 Claims, 2 Drawing Sheets

METHOD FOR ESTIMATING AGE RATE OF A LASER

FIELD OF THE INVENTION

The present invention relates generally to a method of testing optoelectronic devices, and in particularly to a method for estimating the age rate of a laser using an integral electroabsorptive modulator (EAM).

BACKGROUND

Semiconductor lasers, as well as other optoelectronic devices must be evaluated for long-term reliability. Often this entails evaluation of the current required for lasing, the threshold current, before a test operation at an elevated temperature; and after the test operation. This is often referred to as 'burn-in' or 'purge' testing.

During purge testing, the laser is operated for a predetermined time at the elevated temperature; and is driven at a relatively high bias current. After this testing is completed, the threshold current is re-evaluated. From these data, a fairly accurate correlation may be made between any changes in the threshold current due to the purge testing and the rate that the laser degrades over time. This degradation is typically referred to as the age-rate of the laser, and may be used in the pass/fail analysis of lasers in a manufacturing setting.

Known methods for purge testing lasers include the use of an external photodetector with intermediate optics, which forms a test apparatus; and the use of a rear facet monitor-detector. While these known methods are useful in accomplishing the desired end, there are certain drawbacks to their use. To this end, there is an attendant cost associated with the test apparatus and its method of testing. Moreover, the total yield in production depends on the individual yields of the elements, and failure of any one element can impact the overall yield of a product. These yields include a purge yield associated with the lasers; and an electro-optical test yield of the lasers.

What is needed, therefore, is a method for evaluating the age-rate of a laser that overcomes at least the drawbacks of known methods described above.

SUMMARY

In accordance with an exemplary embodiment of the present invention, a method of evaluating a laser comprises providing a current into the laser and measuring a voltage output of an electroabsorptive modulator (EAM) coupled to the laser.

In accordance with another exemplary embodiment of the present invention, a device under test includes a laser, and an electroabsorptive modulator (EAM), wherein said EAM monitors an output of said laser.

In accordance with yet another exemplary embodiment of the present invention, a device under test includes a laser and an optical monitor, which is not an external optical detector.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion.

DETAILED DESCRIPTION

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Figure 1:
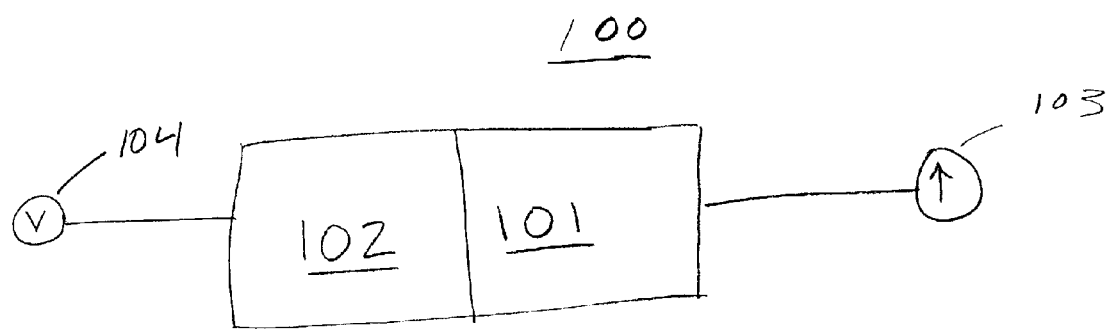
FIG. 1 is a perspective view of a laser under test in accordance with an exemplary embodiment of the present invention.

FIG. 1 shows an electroabsorptive modulated laser (EML) 100 in accordance with an exemplary embodiment of the present invention. The EML 100 may be a device under test in a manufacturing environment or a deployed device. The EML 100 illustratively includes a laser 101 having an electroabsorptive modulator (EAM) 102 coupled thereto. The EAM 102 may be integrally formed with the laser 101, or may be a separate device. A laser driver 103 injects current into the laser, and may be controlled by driver circuitry (not shown). A voltmeter 104 is used to measure a voltage across the EAM 102, and can be used to provide a measure of the threshold current by evaluating the voltage response when sweeping laser current during device testing.

The laser 101 is illustratively a semiconductor laser, such as a multi-quantum well (MQW) laser. The laser 101 may be a distributed feedback laser (DFB). Of course, other types of laser devices such as laser diodes, as well as other lasers and light emitting devices, which benefit from long-term monitoring and reliability testing during manufacture may be tested/monitored in accordance with an exemplary embodiment of the present invention. Such devices are well within the purview of one having ordinary skill in the art to which the present invention relates. As the laser 101 and EAM 102 are generally well known in the art, generally only details germane to the present inventive method will be described.

In operation in a communications link, a time-varying voltage may be applied across the EAM 102 using a voltage supply (not shown) to temporally alter (e.g., lower) the absorption edge of the active region (e.g., by the Franz-Keldysh effect) of the EAM 102. This alters the intensity of the emitted light in a time-varying manner. In the example when the absorption edge is lowered, the emitted light is reduced when the voltage is applied, and thereby the laser 101 is intensity varies with time. Of course, this example merely illustrates the types of devices and types of modulation that may be effected. Other devices based on other electroabsorptive modulation technologies may be used in carrying out the present invention.

Accordingly, the EAM 102 may be variably biased to alter the absorption edge thereof so that light of a particular wavelength (e.g., the wavelength of the laser 101) is more strongly absorbed when the bias is applied, and less-strongly absorbed when the bias is not applied. This is referred to as intensity modulation of the laser 101, and is the basis of operation of the EML 100.

However, the EAM 102 normally includes an active layer. As can be readily appreciated, the bias voltage applied across the EAM may be zero (zero biased) or a constant finite value (referred to herein as DC biased) to effect absorption of light from the laser 101. To this end, when the EAM 102 absorbs light having a wavelength that has a wavelength corresponding to the bandgap wavelength of the active layer of the EAM 102, electron/hole pairs are created. As such, when the EAM 102 is not biased or is DC biased so that the bandgap wavelength matches the wavelength of the light emitted from the laser, a photocurrent is produced in the EAM 102 that is directly proportional to the intensity of the optical signal from the laser 101. This photocurrent, through the series resistance of the EAM 102 provides a voltage across the two terminals of the EAM 102. This voltage may be measured by the voltmeter 104.

In accordance with an exemplary embodiment of the present invention, the EAM 102 may be used to monitor the output intensity of the laser 101 of the EML 100. Usefully, the EAM 102 provides a measure of the intensity of the output signal via the measured voltage at voltmeter 104. Because the injection current supplied to the laser 101 via the laser driver 103 is readily determined, the laser current vs. output voltage may be determined, providing a direct measure of the laser current (drive current) versus the laser output intensity. From such a graph, the threshold current may be determined. Moreover, as explained in further detail below, age-testing of the laser 101 of the EML 100 maybe carried out using the same EAM 102 that functions as an intensity modulator in the deployed device.

Monitoring/testing of the aging of the laser 101 is effected using a zero bias or DC bias EAM 102 in accordance with embodiment of the present invention. Advantageously, therefore, the same EAM 102 used for intensity modulation of the laser 101 by varying the applied voltage to the EAM 102 during operation may be used in the age-testing of the laser during manufacture by measuring the optical intensity of the output of the laser 101. It is noted that the monitoring may be effected during testing in a manufacturing setting by the illustrative technique described presently. Alternatively, or additionally, the monitoring using the EAM 102 may be effected in a deployed device by using a similar technique to that described.

In accordance with an exemplary embodiment of the present invention, the EML 100 is tested during the manufacturing sequence by applying a DC bias or zero bias to the EAM 102 during operation of the laser 101 at a desired operating point. The applied bias voltage is chosen so the bandgap wavelength of the active layer of the EAM 102 substantially matches that of the laser 101. The light emitted from the laser 101 is thus absorbed by the EAM 102 creates carriers in the conduction (and valence) band of the EAM 102. This photocurrent is measured by the voltmeter 104 as described above, and the measured voltage is directly proportional to the intensity of the light emitted from the laser 101. As such, a direct correlation over time of the measured photocurrent (which is proportional to the output optical power) to the injection current supplied to the laser via the laser driver is obtained to evaluate the aging of a laser. Moreover, the relationship of the drive current to the output power can be measured/monitored in a deployed device by similar technique.

Figure 2:
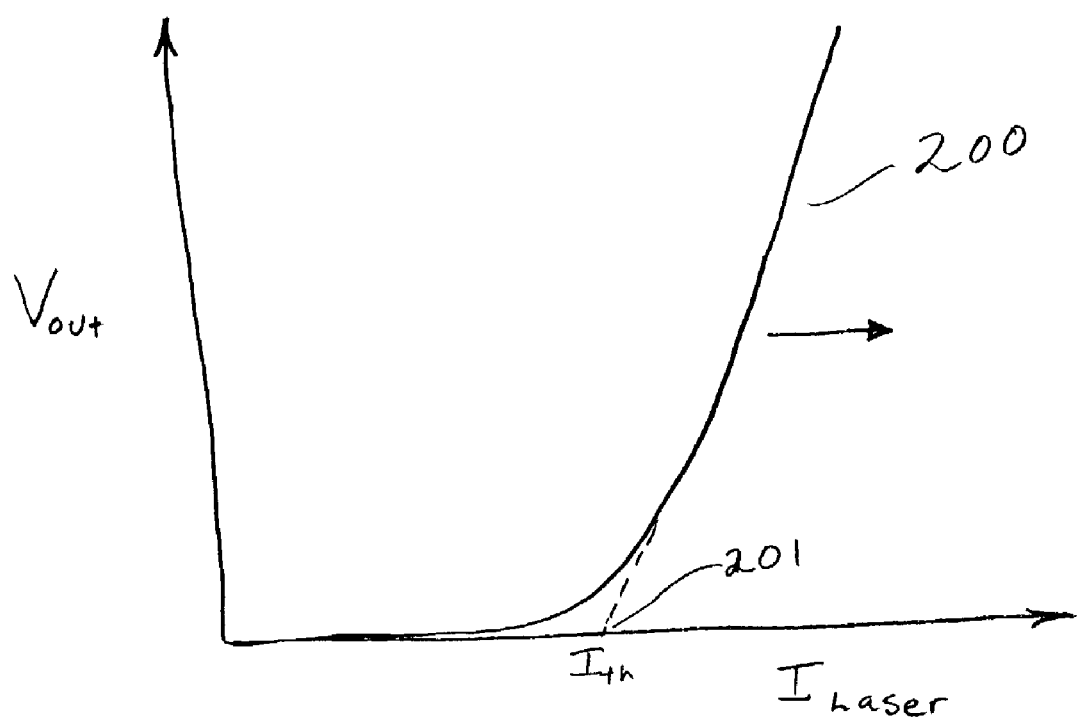
FIG. 2 is a graphical representation of the laser injection current versus the voltage output of the EAM in accordance with an exemplary embodiment of the present invention.

FIG. 2 shows a graph of the output voltage ($V_{out}$) of the EAM 102 (measured by the voltmeter 104) versus the laser drive current ($I_{laser}$) from the laser driver 103 in accordance with an exemplary embodiment of the present invention. As can be readily appreciated from a review of FIG. 2, the tangent to the curve provides the threshold current level ($I_{th}$) of the laser for a particular output optical power. As the laser 101 is tested during a purge test procedure, or if the laser 101 is monitored during deployed operation, the curve 200 may shift (for example, as indicated by the arrow shown in FIG. 2) indicative of a change in the threshold current for a desired optical output power level. As such, the EAM 102 provides a measure of the threshold current during (including changes therein) purge testing, enabling an accurate prediction of the age rate of the laser 101. The EAM 102 may also be used during deployed operation as a laser monitor, enabling the measure of the optical output intensity of the laser 101 as well as a measure of laser output wavelength drift. The latter measure is often effected using a separate optical detector.

From a review of the above description of some exemplary embodiments of the present invention, it can be appreciated that by using the EAM 102 to measure the output optical power of the laser during purge testing, as well as to monitor laser output of the deployed EML 100, certain advantages are realized. First, the use of a separate optical detector or test apparatus is foregone. As such, the overall cost of manufacturing the EML 100 is reduced. To wit, in conventional purge testing, the photodetector used for monitoring the output optical power is disposed on the EML subassembly, which also necessarily includes the EAM and the laser. If an EML fails purge-testing, the entire assembly, including the additional photodetector, is discarded. In stark contrast, the present invention requires no additional photodetector to the EML assembly. Therefore, if an EML fails purge-testing, no additional elements specifically required for the purge testing are discarded. Ultimately, this fosters improved economic efficiencies when compared to known purge-testing techniques.

In addition to the advantages described above, compared to known apparati and methods using an external detector, the exemplary embodiments provide improved precision of relative measure of the optical power before and after burn-in. To this end, by using the monolithically integrated EAM as the detector, the optical coupling between the laser 101 and the EAM 102 is substantially constant. Moreover, if a measurement apparatus has multiple detectors/sockets, additional variation can be introduced when a different detector/socket is used between two measurements. The use of the EAM 102 as the detector as described in connection with the exemplary embodiments above clearly avoids this drawback of known measurement and testing methods and apparati.

The invention having been described in detail, it will be readily apparent to one having ordinary skill in the art that the invention may be varied in a variety of ways. Such variations are not to be regarded as a departure from the scope of the invention. All such modifications as would be obvious to one of ordinary skill in the art, having had the benefit of the present disclosure, are intended to be included within the scope of the appended claims and the legal equivalents thereof.

What is claimed is:

1. A device under test, comprising:
   A laser, and an electroabsorptive modulator (EAM), wherein said EAM monitors an output of said laser to estimate an age-rate of said laser.

2. A device under test as recited in claim 1, wherein a threshold current ($I_{th}$) is determined from said measured voltage output of said EAM.

3. A device as recited in claim 2, further comprising providing a voltage to said electrobsorptive modulator.

4. A device as recited in claim 3, wherein said voltage provided to said electroabsorptive modulator biases said electroabsorptive modulator to absorb light of a particular wavelength from said laser.

5. A device as recited in claim 4, wherein said absorbed light creates a photocurrent in said electroabsorptive modulator.

6. A device as recited in claim 3, wherein said voltage provided to said electroabsorptive modulator has a zero magnitude.

7. A device as recited in claim 3, wherein said voltage provided to said electroabsorptive modulator is substantially constant.

8. A device as recited in claim 1, wherein a threshold current is measured before and after purging the laser without using an external optical detector.

* * * * *